United States Patent
Urabe et al.

(10) Patent No.: US 7,673,207 B2
(45) Date of Patent: Mar. 2, 2010

(54) METHOD FOR AT SPEED TESTING OF DEVICES

(75) Inventors: Masayuki Urabe, Isehara (JP); Akio Goto, Hatogaya (JP)

(73) Assignee: Marvell International Ltd., Hamilton (BM)

( * ) Notice: Subject to any disclaimer, the term of this patent is extended or adjusted under 35 U.S.C. 154(b) by 290 days.

(21) Appl. No.: 11/818,830

(22) Filed: Jun. 15, 2007

(65) Prior Publication Data

US 2008/0010576 A1   Jan. 10, 2008

(51) Int. Cl.
*G06F 11/00* (2006.01)

(52) U.S. Cl. ............... 714/735; 714/732; 714/733; 714/734; 714/736; 714/737; 714/799; 714/800; 714/807; 714/819; 714/824; 714/25; 714/43; 714/56; 714/715; 714/716; 714/717; 714/718; 714/724; 714/741; 714/742; 375/221

(58) Field of Classification Search .............. None
See application file for complete search history.

(56) References Cited

U.S. PATENT DOCUMENTS

| | | | | |
|---|---|---|---|---|
| 4,107,649 A * | 8/1978 | Kurihara | ............ | 714/703 |
| 5,228,042 A * | 7/1993 | Gauthier et al. | ............ | 714/716 |
| 5,787,114 A * | 7/1998 | Ramamurthy et al. | ....... | 375/221 |
| 5,802,073 A * | 9/1998 | Platt | ................. | 714/733 |
| 6,477,674 B1 * | 11/2002 | Bates et al. | ............ | 714/738 |
| 6,480,016 B1 * | 11/2002 | Motoi et al. | ............ | 324/765 |
| 7,093,172 B2 * | 8/2006 | Fan et al. | ............ | 714/716 |
| 7,213,186 B2 * | 5/2007 | Chien | ................. | 714/733 |
| 7,492,198 B2 * | 2/2009 | Suda | ................. | 327/158 |
| 7,509,517 B2 * | 3/2009 | Matsumoto et al. | ......... | 713/600 |
| 7,533,317 B2 * | 5/2009 | Bonneau et al. | ............ | 714/733 |
| 2001/0041967 A1 * | 11/2001 | Nakayama | ............ | 702/117 |
| 2003/0149921 A1 * | 8/2003 | Lau et al. | ............ | 714/704 |
| 2004/0030968 A1 * | 2/2004 | Fan et al. | ............ | 714/704 |
| 2004/0177314 A1 * | 9/2004 | Kleihorst et al. | ............ | 714/801 |
| 2004/0250187 A1 * | 12/2004 | Schauer et al. | ............ | 714/728 |
| 2007/0127614 A1 * | 6/2007 | Kawakami | ............ | 375/373 |
| 2007/0277066 A1 * | 11/2007 | Gajapathy et al. | ......... | 714/724 |

FOREIGN PATENT DOCUMENTS

JP           07-151823           6/1995

* cited by examiner

*Primary Examiner*—John P Trimmings

(57) ABSTRACT

A semiconductor device that includes a module under test that is integrated with the semiconductor device, that receives an input signal from a test module, and that provides an output signal to at least one output terminal based on the input signal. An error detecting module is integrated with the semiconductor device, samples values of the output signal, and outputs the sampled values to the test module.

48 Claims, 15 Drawing Sheets

METHOD FOR AT SPEED TESTING OF DEVICES

CROSS-REFERENCE TO RELATED APPLICATIONS

This application claims the benefit of Japanese Patent Application No. 2006-176036, filed on Jun. 27, 2006. The disclosure of the above application is incorporated herein by reference in its entirety.

FIELD

The present disclosure relates to testing of semiconductor devices, and more particularly to sampling output signals of semiconductor devices during testing.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a device under test (DUT) such as a semiconductor device 10 receives an input signal 12 from a test apparatus (such as test module 14) to determine whether an appropriate output signal 16 is generated based on the input signal 12. For example, the test module 14 may include a pattern generator module 18 that provides the input signal 12. The semiconductor device 10 generates the output signal 16 based on the input signal 12.

The test module 14 samples the output signal 16 to determine whether the semiconductor device 10 generated the proper output signal 16. For example, the test module 14 may include a sampling module 20 that receives and samples the output signal 16. The test module 14 stores the samples (i.e. measurement results) of the output signal 16 in, for example, a memory 22. The test module 14 determines a status (e.g. a pass or fail status) of the semiconductor device 10 based on the measurement results of the output signal 16 that are stored in the memory 22. For example, the test module 14 may include a comparison module 24. The comparison module 24 compares the measurement results to stored values that are indicative of a proper (i.e. expected) output signal in view of the input signal 12.

In this manner, the test module 14 determines whether the device under test (i.e. the semiconductor device 10) operates according to a predetermined specification. For example, a test apparatus for testing a synchronous DRAM may input a predetermined input signal to the synchronous DRAM, capture an output signal of the synchronous DRAM corresponding to the input signal, and compare the output signal with an expected value.

Referring now to FIG. 2, the semiconductor device 10 may be connected to the test module 14 via a socket on a test head 30. The semiconductor device 10 receives the input signal 12 from the test module 14 via the test head 30. Similarly, the test module 14 receives the output signal 16 from the semiconductor device 10 via the test head 30.

The test module 14 may be designed to test multiple semiconductor devices simultaneously, which increases the size of the test module 14. As the size of the test module 14 increases, signal lines (i.e. signal lines for the input signal 12 and the output signal 16) between the test module 14 and the semiconductor device 10 (and/or the test head 30) increase in length. As the signal line length increases, validity of the test results may decrease. For example, the device under test may be tested under conditions that differ from the actual operation of the device (e.g. as a result of signal line attenuation).

SUMMARY

A semiconductor device includes a module under test that is integrated with the semiconductor device, that receives an input signal from a test module, and that provides an output signal to at least one output terminal based on the input signal. An error detecting module is integrated with the semiconductor device, samples values of the output signal, and outputs the sampled values to the test module.

In other features of the invention, the semiconductor device includes the test module. A system includes the semiconductor device and further includes the test module. The test module includes a pattern generator module and the module under test receives the input signal from the pattern generator module. The test module includes a test result module and the test result module receives the sampled values from the error detecting module. The test result module determines a status of the semiconductor device based on the sampled values.

In other features of the invention, the error detecting module includes a sampling module that samples the values of the output signal. A feedback circuit receives the output signal from the module under test and provides the output signal to the error detecting module. The error detecting module further includes a memory that receives the output signal from the module under test and stores data indicative of the output signal. The data is bit data. The error detecting module receives the data from the memory and detects errors in the output signal based on the data.

In other features of the invention, the module under test generates an error detection signal based on the input signal and the error detecting module receives the error detection signal and detects errors in the output signal based on the error detection signal. The module under test outputs a clock signal and the error detecting module samples the values of the output signal based on the clock signal. The error detecting module includes a comparator module that compares the sampled values to expected values. The error detecting module includes an expected value storage module that stores the expected values. The error detecting module includes a comparison result storage module that stores results of the comparison and provides the results to the test module. The error detecting module includes a comparison result module that determines a status of the semiconductor device based on the comparison. The error detecting module includes an expected value calculating module that receives the input signal and calculates the expected values based on the input signal.

In other features of the invention, the error detecting module includes a clock signal generating module that receives the input signal and generates a clock signal based on the input signal. A first delay element receives the output signal. A second delay element delays the clock signal. The first delay element is a variable delay element and the second delay element is a fixed delay element. A delay of the first delay element is variable between a first delay time that is less than a delay of the second delay element and a second delay time that is greater than the delay of the second delay element. The error detecting module samples the output signal when a delay time of the first delay element is changed. The delay of the second delay element is greater than at least one of a setup time and a hold time of the semiconductor device. A difference between a maximum delay time of the first delay element and the delay of the second delay element is greater than at least one of the setup time and the hold time. The error detecting module includes a sample value storage module that stores the sampled values.

A semiconductor device includes circuit means under test that is integrated with the semiconductor device for receiving an input signal from testing means and for providing an output signal to at least one output terminal based on the input signal, and error detecting means that is integrated with the semiconductor device for sampling values of the output signal and for outputting the sampled values to the test module.

In other features of the invention, the semiconductor device further includes the testing means. A system includes the semiconductor device and further includes the testing means. The testing means includes pattern generating means for generating the input signal and the circuit means receives the input signal from the pattern generating means. The testing means includes test result means for receiving the sampled values from the error detecting means. The test result means determines a status of the semiconductor device based on the sampled values. The error detecting means includes sampling means for sampling the values of the output signal. The semiconductor device further includes feedback circuit means for receiving the output signal from the circuit means and for providing the output signal to the error detecting means.

In other features of the invention, the error detecting means further includes memory means for receiving the output signal from the circuit means and for storing data indicative of the output signal. The data is bit data. The error detecting means receives the data from the memory means and detects errors in the output signal based on the data. The circuit means generates an error detection signal based on the input signal and the error detecting means receives the error detection signal and detects errors in the output signal based on the error detection signal. The circuit means outputs a clock signal and the error detecting means samples the values of the output signal based on the clock signal.

In other features of the invention, the error detecting means includes comparator means for comparing the sampled values to expected values. The error detecting means includes expected value storage means for storing the expected values. The error detecting means includes comparison result storage means for storing results of the comparison and provides the results to the testing means. The error detecting means includes comparison result means for determining a status of the semiconductor device based on the comparison. The error detecting means includes expected value calculating means for receiving the input signal and for calculating the expected values based on the input signal.

In other features of the invention, the error detecting means includes clock signal generating means for receiving the input signal and for generating a clock signal based on the input signal. The semiconductor device further includes first delay means for receiving the output signal and second delay means for delaying the clock signal. The first delay means is a variable delay element and the second delay means is a fixed delay element. A delay of the first delay means is variable between a first delay time that is less than a delay of the second delay means and a second delay time that is greater than the delay of the second delay means. The error detecting means samples the output signal when a delay time of the first delay means is changed. The delay of the second delay means is greater than at least one of a setup time and a hold time of the semiconductor device. A difference between a maximum delay time of the first delay means and the delay of the second delay means is greater than at least one of the setup time and the hold time. The error detecting means includes sample value storage means for storing stores the sampled values.

A method for testing a semiconductor device includes receiving an input signal from a test module at a module under test that is integrated with the semiconductor device, providing an output signal to at least one output terminal based on the input signal, sampling values of the output signal at an error detecting module that is integrated with the semiconductor device, and outputting the sampled values to the test module.

In other features of the invention, the method further includes receiving the input signal from a pattern generator module. The method further includes receiving the sampled values at a test result module. The method further includes determining a status of the semiconductor device based on the sampled values. The method further includes receiving the output signal from the module under test at a feedback circuit and providing the output signal to the error detecting module. The method further includes receiving the output signal at a memory and storing data indicative of the output signal. The data is bit data. The method further includes receiving the data from the memory and detecting errors in the output signal based on the data.

In other features of the invention, the method further includes generating an error detection signal based on the input signal at the module under test, receiving the error detection signal at the error detection module, and detecting errors in the output signal based on the error detection signal. The method further includes outputting a clock signal from the module under test and sampling the values of the output signal based on the clock signal. The method further includes comparing the sampled values to expected values. The method further includes storing the expected values.

In other features of the invention, the method further includes storing results of the comparison and providing the results to the test module. The method further includes determining a status of the semiconductor device based on the comparison. The method further includes calculating the expected values based on the input signal. The method further includes delaying the output signal based on a first delay. The method further includes delaying the clock signal based on a second delay. The first delay is a variable delay and the second delay is a fixed delay. The first delay is variable between a first delay time that is less than the second delay and a second delay time that is greater than the second delay.

In other features of the invention, the method further includes sampling the output signal when the first delay is changed. The second delay is greater than at least one of a setup time and a hold time of the semiconductor device. A difference between a maximum delay time of the first delay and the second delay is greater than at least one of the setup time and the hold time. The method further includes storing the sampled values.

A computer program stored for use by a processor for operating a semiconductor device includes receiving an input signal from a test module at a module under test that is integrated with the semiconductor device, providing an output signal to at least one output terminal based on the input signal, sampling values of the output signal at an error detecting module that is integrated with the semiconductor device, and outputting the sampled values to the test module.

In other features of the invention, the computer program further includes receiving the input signal from a pattern generator module. The computer program further includes receiving the sampled values at a test result module. The computer program further includes determining a status of the semiconductor device based on the sampled values. The computer program further includes receiving the output signal from the module under test at a feedback circuit and providing the output signal to the error detecting module. The computer program further includes receiving the output signal at a memory and storing data indicative of the output signal. The data is bit data. The computer program further includes receiving the data from the memory and detecting errors in the output signal based on the data.

In other features of the invention, the computer program further includes generating an error detection signal based on the input signal at the module under test, receiving the error detection signal at the error detection module, and detecting errors in the output signal based on the error detection signal. The computer program further includes outputting a clock signal from the module under test and sampling the values of the output signal based on the clock signal. The computer program further includes comparing the sampled values to expected values. The computer program further includes storing the expected values.

In other features of the invention, the computer program further includes storing results of the comparison and providing the results to the test module. The computer program further includes determining a status of the semiconductor device based on the comparison. The computer program further includes calculating the expected values based on the input signal. The computer program further includes delaying the output signal based on a first delay. The computer program further includes delaying the clock signal based on a second delay. The first delay is a variable delay and the second delay is a fixed delay. The first delay is variable between a first delay time that is less than the second delay and a second delay time that is greater than the second delay.

In other features of the invention, the computer program further includes sampling the output signal when the first delay is changed. The second delay is greater than at least one of a setup time and a hold time of the semiconductor device. A difference between a maximum delay time of the first delay and the second delay is greater than at least one of the setup time and the hold time. The computer program further includes storing the sampled values.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
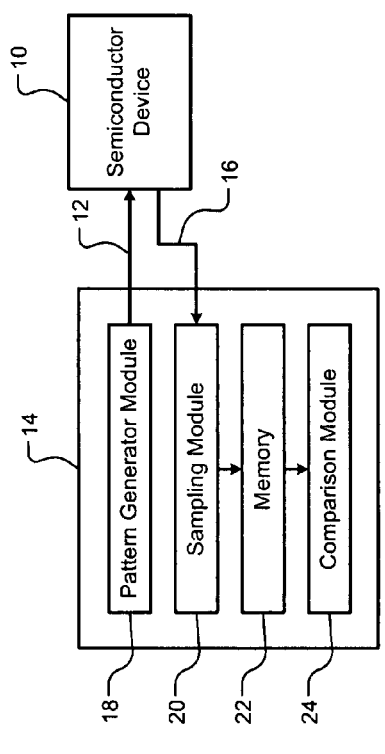
FIG. 1 is a functional block diagram of device under test (DUT) according to the prior art.
Figure 2:
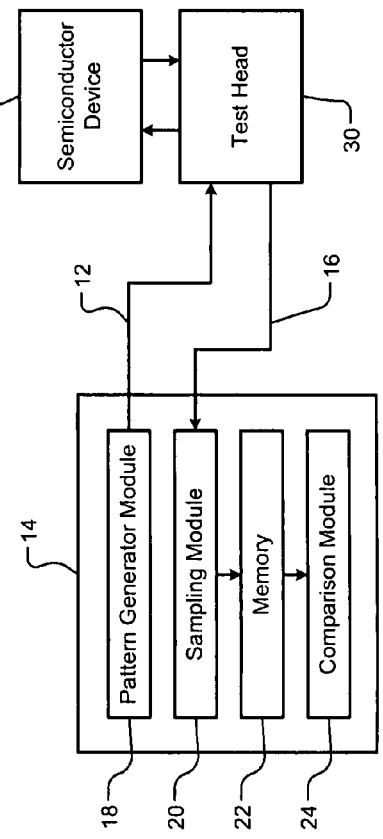
FIG. 2 is a functional block diagram of an alternative DUT according to the prior art.

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3:
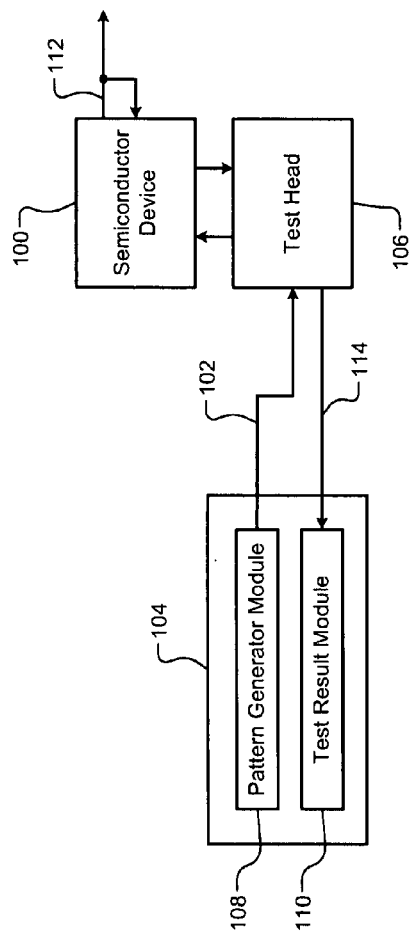
FIG. 3 is a functional block diagram of a semiconductor device according to the present disclosure.

Referring now to FIG. 3, a device under test (DUT) such as a semiconductor device 100, according to an exemplary embodiment of the present disclosure is shown. The DUT, for example, may include a module (as described above in the preceding paragraph) under test. The semiconductor device 100 including the module under test may implement or be implemented on one of an integrated circuit (IC) and a system on a chip (SOC). The semiconductor device 100 receives an input signal 102 from a test module 104 via a test head 106. The test module 104 includes a pattern generator module 108 and a test result module 110.

The test module 104 provides the input signal 102 to the semiconductor device 100 via the pattern generator module 108. The semiconductor device 100 generates an output signal 112 based on the input signal 102. The semiconductor device 100 samples the output signal 112 and stores test data based on the output signal 112 on the semiconductor device 100. For example, the semiconductor device 100 may store sampled values of the output signal 112 and/or test results (e.g. detected errors) in a memory. The semiconductor device 100 may compare the stored values to expected values and store comparison results. For example, the expected values may be selected based on the input signal 102. The comparison results may indicate whether the stored values match the expected values.

In other words, because the output signal 112 is sampled and/or stored at the semiconductor device 100, inaccuracies due to, for example, signal line attenuation, are avoided. Sampled and stored values of the output signal 112 are more representative of an output signal of the semiconductor device 100 in actual operating conditions.

The semiconductor device 100 generates a result signal 114 based on the sampled output signal 112. For example, the result signal 114 may include values of the output signal 112 and/or comparison results. The test result module 110 receives the result signal 114 from the semiconductor device 100 via the test head 106. The test result module 110 determines a status of the semiconductor device 100 based on the result signal 114. For example, the test result module 110 may generate a pass/fail status of the semiconductor device 100 based on the result signal 114.

Figure 4:
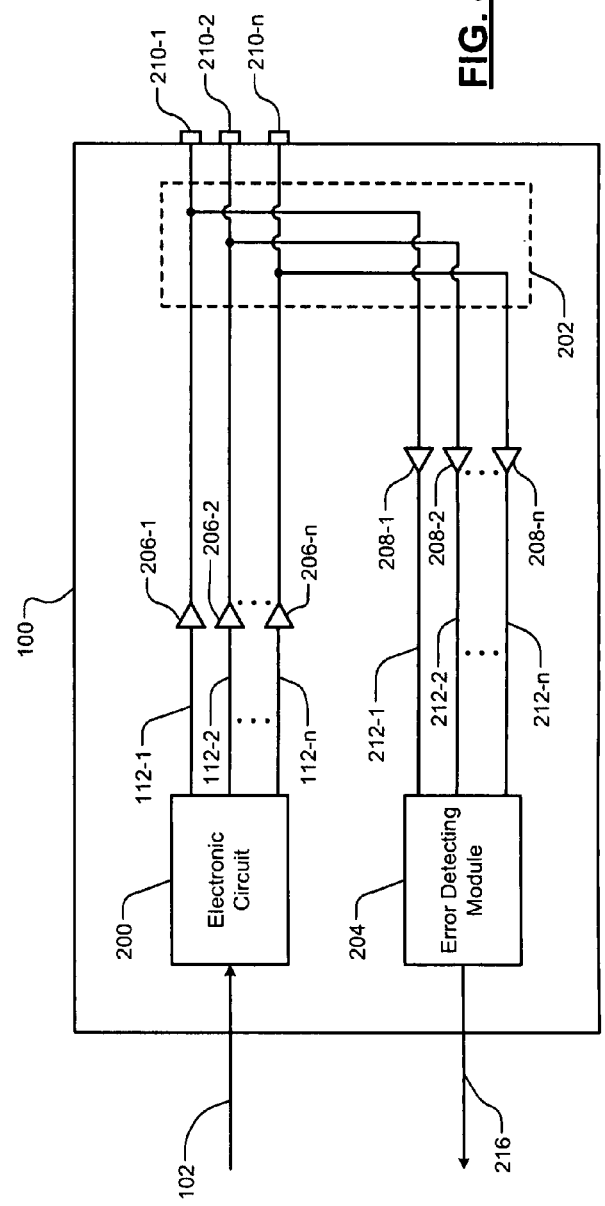
FIG. 4 is a functional block diagram of a semiconductor device shown in more detail according to the present disclosure.

Referring now to FIG. 4, a semiconductor device 100 according to the present disclosure is shown in more detail. The semiconductor device 100 includes a module under test (such as an electronic circuit 200), a feedback circuit 202, an error detecting module 204, one or more output drivers 206-1, 206-2, . . . , and 206-*n* (referred to collectively as output drivers 206), one or receivers 208-1, 208-2, . . . , and 208-*n* (referred to collectively as receivers 208), and corresponding external terminals 210-1, 210-2, . . . , and 210-*n* (referred to collectively as external terminals 210). Those skilled in the art can appreciate that the module under test may also include, but is not limited to, an ASIC, a processor and memory that execute one or more software or firmware programs, and a combinational logic circuit.

The electronic circuit 200 receives the input signal 102 from the test module 104 (e.g. from the pattern generator module 108). The electronic circuit 200 generates the output signal 112 according to the input signal 102. For example, the electronic circuit 200 may generate a plurality of the output signals 112 (e.g. output signals 112-1, 112-2, . . . , and 112-*n*, hereinafter referred to collectively as the output signals 112) to the external terminals 210 through a plurality of signal lines and the output drivers 206. Each of the external terminals 210 outputs the respective output signal 112.

The feedback circuit 202 provides each of the output signals 112 to internal circuitry of the semiconductor device 100. For example, the feedback circuit 202 provides the output signals 112 to the error detecting module 204 via feedback signals 212-1, 212-2, . . . , and 212-*n* (referred to collectively as feedback signals 212). The feedback circuit 202 provides the feedback signals 212 to the error detecting module 204 via the receivers 208.

The error detecting module 204 detects errors in one or more of the output signals 112 based on the feedback signals 212. For example, the output signal 112-1 may be a data signal. Conversely, the output signal 112-2 may be an error detection signal. The error detecting module 204 detects errors in the output signal 112-1 (i.e. the data signal) based on the output signal 112-1 and the output signal 112-2 (i.e. the error detection signal). For example, the output signal 112-2 may be an error detection signal that includes an error detection code for detecting a data error, including, but not limited to, a parity bit, a cyclic redundancy check (CRC) code, or an error correcting code (ECC).

The error detecting module 204 determines an error detection result 216 based on the output signals 112. For example, the error detecting module 204 may calculate a verification result of the output signal 112-1 based on a predetermined operation expression (e.g. parity, CRC, and/or ECC verification). The error detecting module 204 compares the verification result to the error detection code included in the output signal 112-2 (i.e. the error detection signal) to detect whether there is an error in the output signal 112-1.

The error detecting module 204 provides the error detection result 216 to the test result module 110 (as shown in FIG. 3). The test result module 110 determines the status of the electronic circuit 200 (e.g. pass or fail) based on the error detection result 216.

In other words, the semiconductor device 100 assesses operation of the electronic circuit 200, including, for example, detecting errors in the output signals 112. The test result module 110 as shown in FIG. 3 does not receive the output signals 112. Instead, the test result module 110 receives the error detection result 216. The error detection result 216 is indicative of the output signals 112 under conditions that are consistent with actual use of the semiconductor device 100 in an end product.

Figure 5:
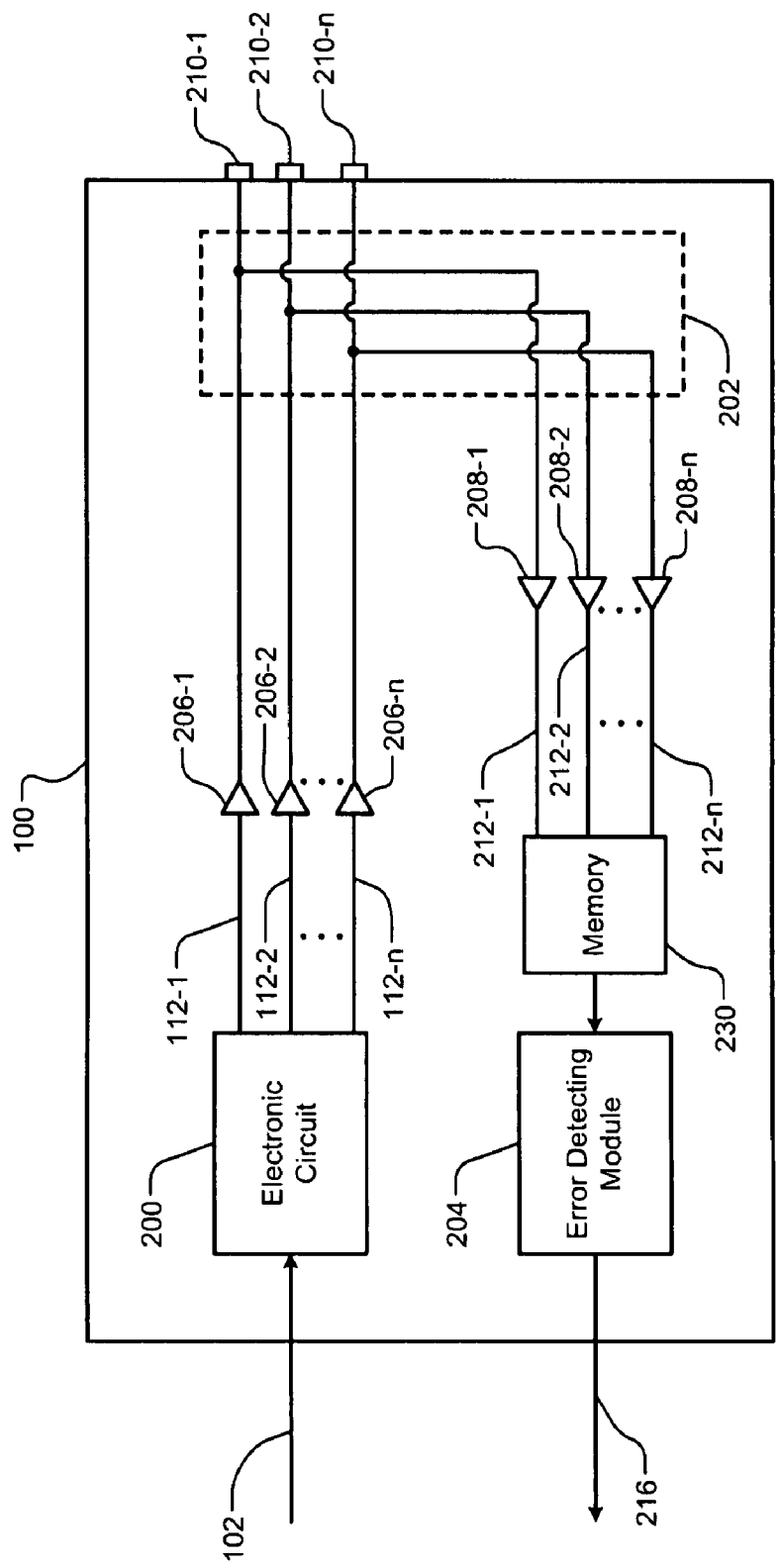
FIG. 5 is a is a functional block diagram of a semiconductor device including a memory according to the present disclosure.

Referring now to FIG. 5, a semiconductor device 100 including a memory 230 is shown. For example, the memory 230 may include, but is not limited to, a volatile (such as a cache) and/or a non-volatile memory module. The feedback circuit 202 provides the feedback signals 212 to the memory 230 via the receivers 208.

The memory 230 stores data indicative of the feedback signals 212 (i.e. data indicative of the output signals 112). For example, the memory 230 may store bit data that represents the feedback signals 212. The memory 230 provides the bit data to the error detecting module 204. The error detecting module 204 detects errors in the output signals 112 based on the bit data stored in the memory 230 and determines the error detection result 216 accordingly. The error detecting module 204 provides the error detection result 216 to the test result module 110 (as shown in FIG. 3). The test result module 110 determines the status of the electronic circuit 200 (e.g. pass or fail) based on the error detection result 216.

Figure 6:
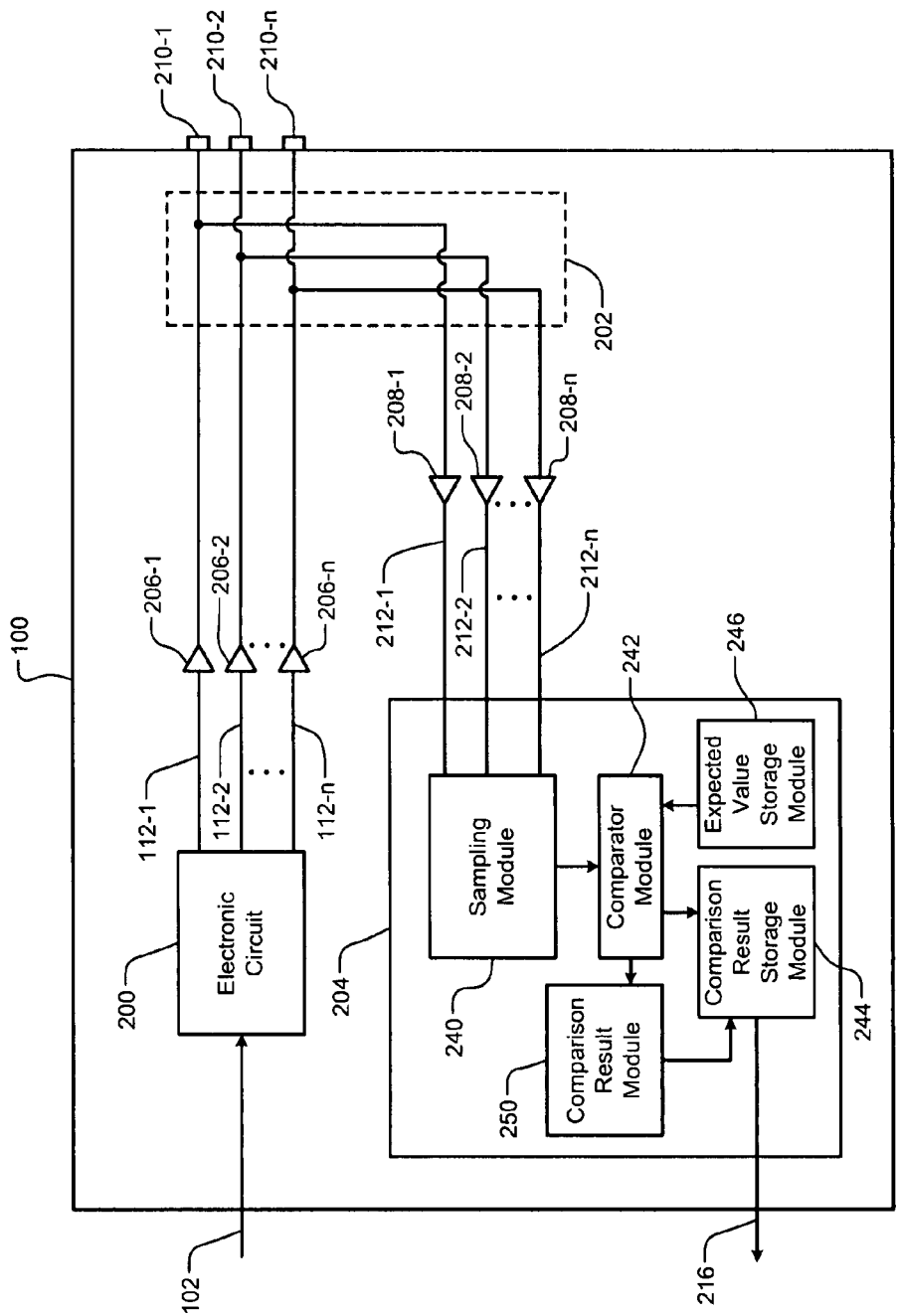
FIG. 6 is a functional block diagram of a semiconductor device including a first implementation of an error detecting module according to the present disclosure.

Referring now to FIG. 6, an exemplary implementation of the error detecting module 204 is shown to include a sampling module 240, a comparator module 242, a comparison result storage module 244, and an expected value storage module 246. For example, the comparison result storage module 244 and the expected value storage module 246 may include a volatile or non-volatile memory module.

In the present implementation, one or more of the output signals 112, such as the output signal 112-1, may be a data signal as described with respect to FIG. 3. The output signal 112-2 may be a clock signal that is indicative of read timing of the output signal 112-1. The sampling module 240 receives the feedback signals 212 from the feedback circuit 202 via the receivers 208. The sampling module 240 samples (e.g. samples values of) the data signals included in the output signals 112 (via the feedback signals 212) based on the clock signal (i.e. the output signal 112-2). For example, the sampling module 240 may include a plurality of sampling circuits (not shown) that each sample respective ones of the feedback signals 212 at a rising edge of the output signal 112-2. The sampling module 240 provides the sampled values of the data signals to the comparator module 242.

The expected value storage module 246 stores expected values of the output signals 112. More particularly, the expected value storage module 246 stores the expected values of the output signals 112 that include the data signals (e.g. the output signal 112-1). For example, the expected values of the outputs signals 112 based on the input signal 102 are previously calculated (e.g. calculated by an external information processor) and stored on the expected value storage module 246.

The expected value storage module 246 provides the stored expected values to the comparator module 242. The comparator module 242 compares the sampled values received from the sampling module 240 to the expected values received from the expected value storage module 240. The comparator module 242 provides a result of the comparison to the comparison result storage module 244. For example, the comparison result may indicate whether the sampled values match the expected values.

The comparison result storage module 244 stores the comparison result. The comparison result storage module 244 provides the stored comparison result (e.g. via the error detection result 216) to the test result module 110. The test result module 110 determines the performance (e.g. pass/fail status) of the semiconductor device 100 based on the comparison result (e.g. based on whether the sampled values match the expected values). For example, the test result module 110 may calculate a setup/hold time of the semiconductor device 100 based on the comparison result.

Alternatively, the semiconductor device 100 may include a comparison result module 250 that receives the comparison results and determines the status (e.g. pass or fail) of the semiconductor device 100. The comparison result module 250 stores the status result in the comparison result storage module 244.

Figure 7:
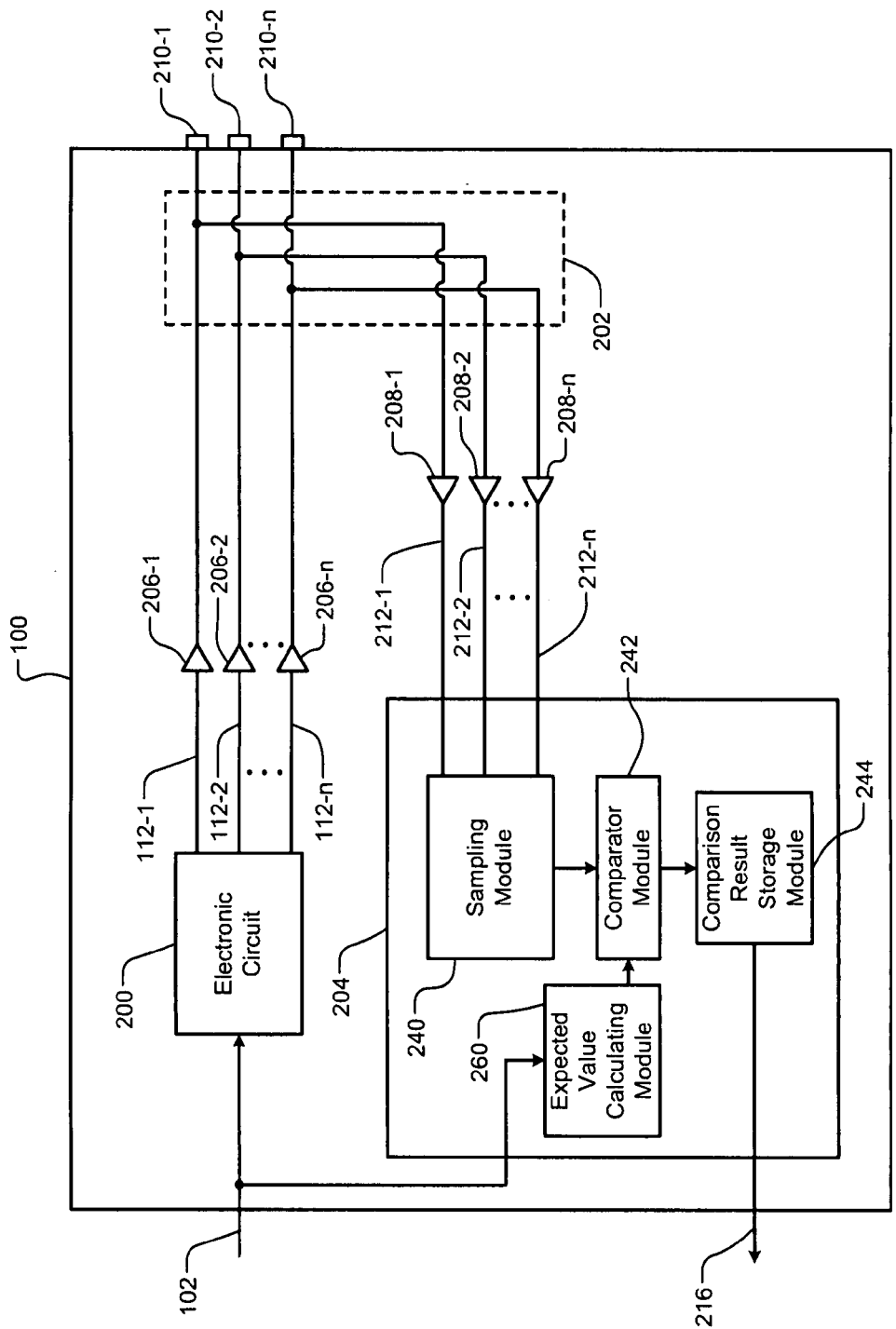
FIG. 7 is a functional block diagram of a semiconductor device including a second implementation of an error detecting module according to the present disclosure.

Referring now to FIG. 7, an exemplary implementation of the error detecting module 204 is shown to include an expected value calculating module 260. The expected value calculating module 260 receives the input signal 102 (e.g. receives the input signal 102 from the pattern generator module 18 as shown in FIG. 3). The expected value calculating module 260 calculates the expected values of the output signals 112 (in particular the output signal 112-1 that includes the data signal). In other words, the expected value calculating module 260 calculates the values of the output signals 112 expected to be provided by the electronic circuit 200 based on the input signal 102.

For example, the expected value calculating module 260 may include an equivalent circuit of the electronic circuit 200 (e.g. a logic circuit representative of the electronic circuit 200). The expected value calculating module 260 provides the calculated expected value to the comparator module 242. The comparator module 242 compares the expected values to the sampled values received from the sampling module 240. The comparator module 242 provides the comparison result to the comparison result storage module 244.

Figure 8:
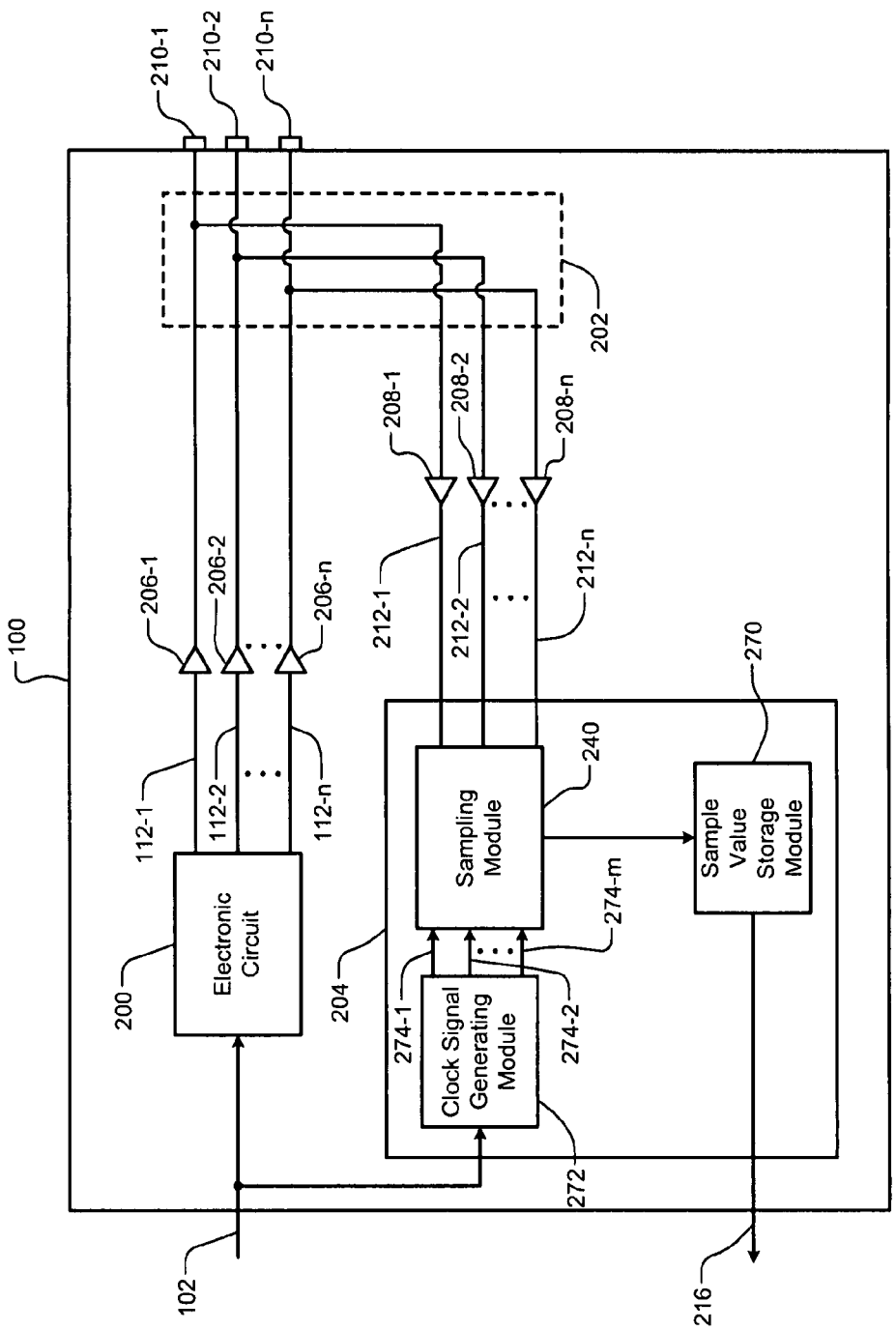
FIG. 8 is a functional block diagram of a semiconductor device including a third implementation of an error detecting module according to the present disclosure.

Referring now to FIG. 8, an exemplary implementation of the error detecting module 204 is shown to include a sample value storage module 270 and a clock signal generating module 272. The clock signal generating module 272 receives the input signal 102. The clock signal generating module 272 generates one or more clock signals 274-1, 274-2, . . . , and 274-m (referred to collectively as clock signals 274) based on the input signal 102. For example, the clock signals 274 may indicate timing of the input signal 102 and the output signals 112. The clock signal generating module 272 may sequentially change leading and trailing edges of (i.e. delay) the clock signals 274.

The sampling module 240 receives the clock signals 274 and samples data (e.g. samples the feedback signals 212) based on the timing of the clock signals 274. For example, the sampling module 240 may sample the data at rising edges of the clock signals 274. In one implementation, the sampling module 240 samples the data when the clock signal generating module 272 delays the clock signals 274 (i.e. changes the timing of a rising edge). The sampling module 240 provides the sampled values to the sample value storage module 270.

The sample value storage module 270 stores the sampled values. For example, the sample value storage module 270 may store the sampled values in an order corresponding to the timing of the clock signals 274. The sample value storage module 270 provides the stored sampled values to the test result module 110 (e.g. via the error detection result 216). The test result module 110 determines the performance (e.g. pass/fail status) of the semiconductor device 100 based on sampled values received from the sample value storage module 270. For example, the test result module 110 may calculate a setup/hold time of the semiconductor device 100 based on the sampled values.

Figure 9:
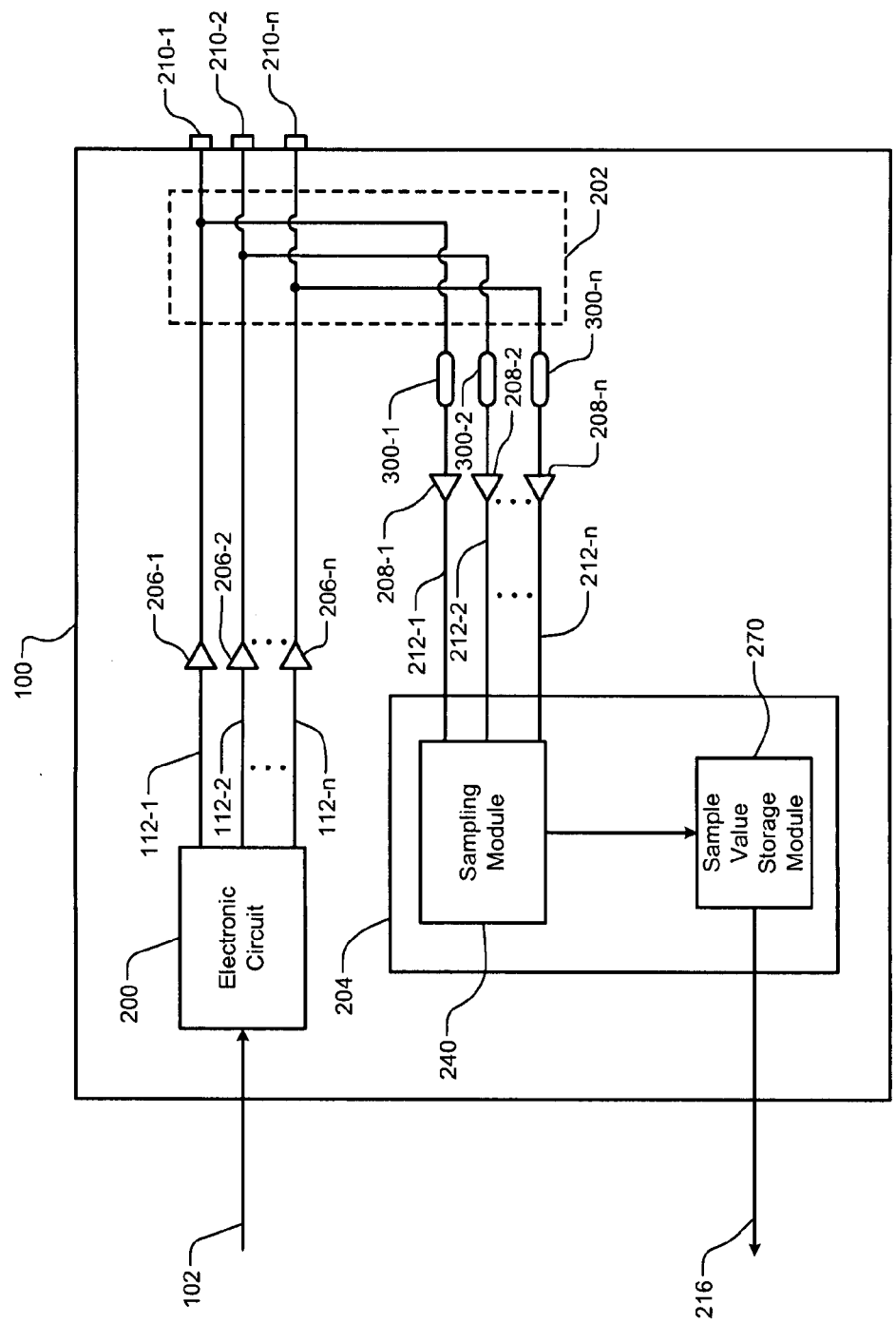
FIG. 9 is a functional block diagram of a semiconductor device including delay elements according to the present disclosure.

Referring now to FIG. 9, an exemplary implementation of the semiconductor device 100 is shown to include delay elements 300-1, 300-2, . . . , and 300-n (referred to collectively as delay elements 300). In the present implementation, the delay elements 300-1 and 300-2 are variable delay elements and the delay element 300-n is a fixed delay element. The delay elements 300 receive the feedback signals 212 from the feedback circuit 202. The error detecting module 204 receives the feedback signals 212 from the delay elements 300 via the receivers 208.

The variable delay elements 300-1 and 300-2 delay one of the feedback signals 212 (i.e. the output signals 112) according to a variable delay time. For example, the variable delay element 300-1 may delay a data signal and the variable delay element 300-2 may delay a clock signal. The fixed delay element 300-n delays one of the feedback signals 212 according to a fixed delay time. In the present implementation, the delay time of the variable delay element 300-1 is variable between a first delay time that is less than the fixed delay time of the fixed delay element 300-n and a second delay time that is greater than the fixed delay time of the fixed delay element 300-n.

The sampling module 240 samples values of the output signals 112 as described in FIGS. 6-8. Here, for example, the sampling module 240 samples the values of the data signal (e.g. the output signal 112-1) based on the variable delay time of the variable delay element 300-1.

In the present implementation, the fixed delay time of the fixed delay element 300-n is greater than a previously determined setup or hold time between the data signal (e.g. the output signal 112-1) and the clock signal (e.g. the clock signal 112-2). A difference between a maximum delay time of the variable delay element 300-1 and the fixed delay time of the fixed delay element 300-n may be greater than the previously determined setup or hold time between the data signal and the clock signal. The previously determined setup or hold time may be based on a specification of the semiconductor device 100 (e.g. based on manufacturer/user specifications).

In this manner, when the data signal (e.g. the output signal 112-1) is delayed, the timing of the clock signal (e.g. the output signal 112-2) may be similarly adjusted or delayed to ensure that the timing of the clock signal is consistent with the data signal. For example, the delay time of the data signal (e.g. rise or fall times of the data signal) may be changed with respect to the clock signal. When the delay time is known, values of the data signal (and/or others of the output signals 112) used, for example, to measure the setup or hold time of the data signal can be determined.

The sampling module 240 provides the sampled values to the sample value storage module 270. The sample value storage module 270 stores the sampled values in association with the corresponding delay times of the delay elements 300. In other words, when the corresponding delay times for each of the sampled values are known (e.g. when the sampled values are stored according to time intervals based on the delay times), it is not necessary to store data associated with the timing of the clock signal. Instead, the sample value storage module 270 may store the sampled values in respective regions that correspond to specific delay times. For example, the sample value storage module 270 may include regions based on a time interval from a predetermined reference time. The sample value storage module 270 provides the stored sampled values to the test result module 110 (e.g. via the error detection result 216).

Figure 10:
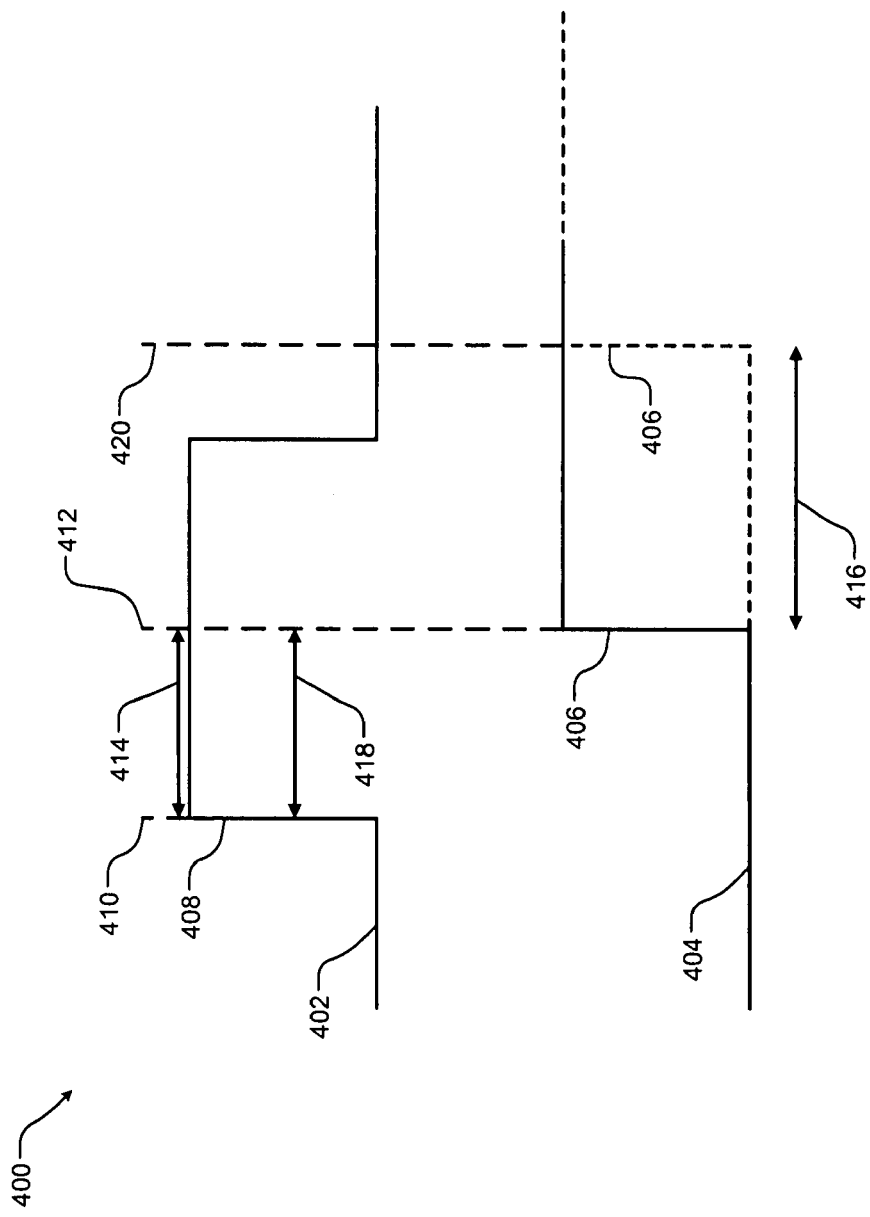
FIG. 10 is a timing diagram of data and clock signals according to the present disclosure.

Referring now to FIG. 10, an exemplary timing diagram 400 includes a data signal 402 and a clock signal 404. The sampling module 240 as described in FIGS. 6-9 samples a value of the data signal 402 at a rising edge 406 of the clock signal 404. When a variable delay element (such as the variable delay element 300-1 as shown in FIG. 9) is connected to a signal line of the data signal 402, the data signal 402 (e.g. a rising edge 408) can be delayed between times 410 and 412 according to the variable delay. Accordingly, the time at which the sampling module 240 samples the value of the data signal 402 can be varied based on the delay. The sample values of the data signal 402 may be stored in the sample value storage module 270 in accordance with corresponding delay times. As such, information required to calculate a setup time 414 of the semiconductor device 100 is stored in the semiconductor device 100. As a result, the setup time 414 can be appropriately determined without providing the data signal 402 externally to the test result module 110.

When a fixed delay element (such as the fixed delay element 300-n as shown in FIG. 9) is connected to the signal line of the clock signal 404, the clock signal 404 is delayed by a fixed delay time 416, and the rising edge 406 is delayed accordingly. A variable delay time 418 of the variable delay element 300-1 can be adjusted to correspond to the fixed delay time 416. In other words, the variable delay time 418 may be adjusted so that the rising edge 406 of the clock signal 404 corresponds to the data at a time 420. The test apparatus 14 may determine the setup time and the hold time of the semiconductor device 100 based on the stored sampled values and associated delay times.

Figure 11:
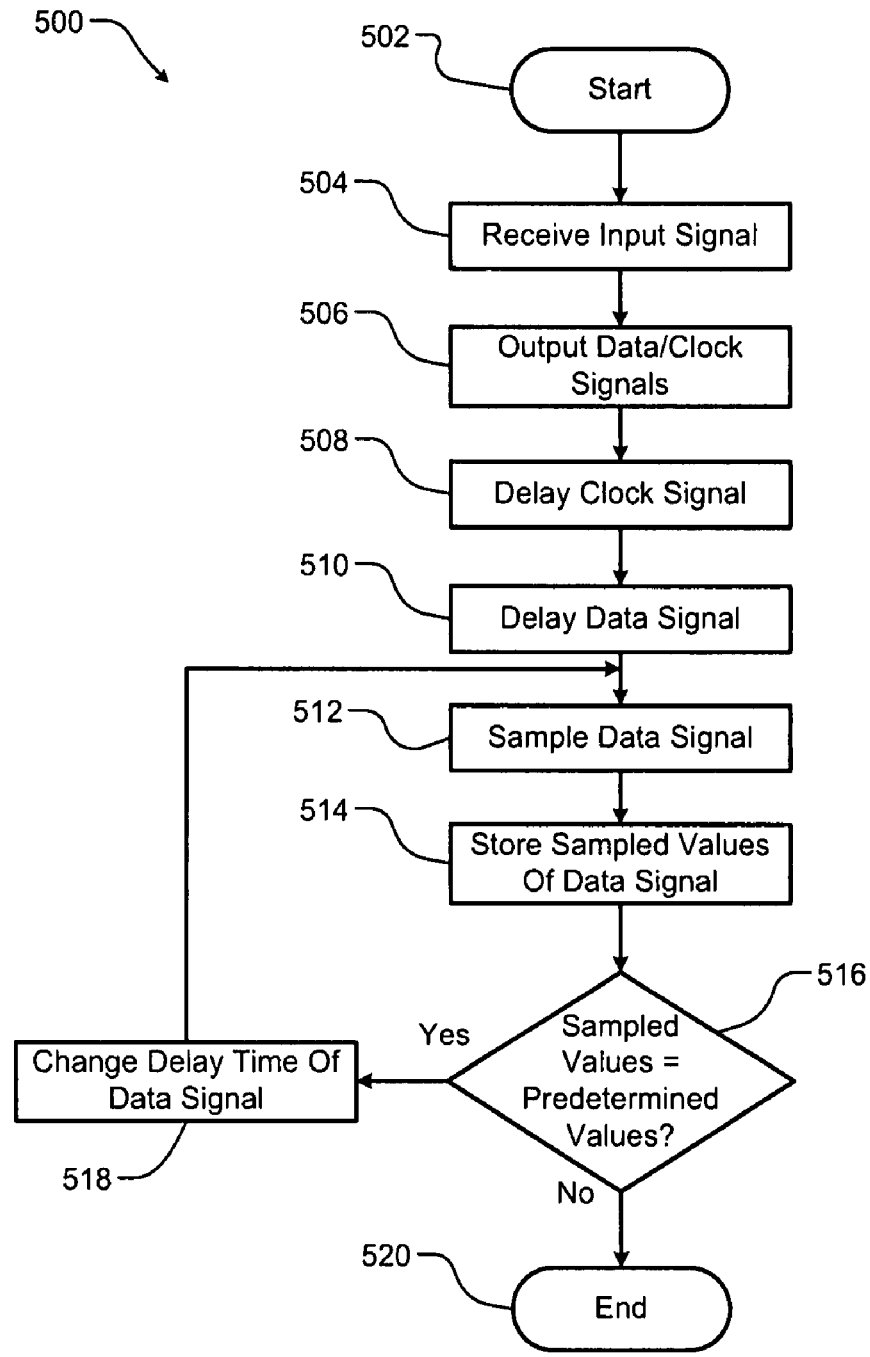
FIG. 11 is a flow diagram illustrating steps of a method for testing a semiconductor device according to the present disclosure.

Referring now to FIG. 11, an exemplary method 500 for testing a semiconductor device 100 according to the embodiments described in FIGS. 9 and 10 begins in step 502. An electronic circuit 200 of the semiconductor device 100 receives an input signal 102 in step 504. The electronic circuit 200 generates output signals 112 (e.g. a data signal and a clock signal) based on the input signal 102 in step 506. Alternatively, a clock signal generating module 272 may output the clock signal 274 as shown in FIG. 8.

A fixed delay element 300-n delays the clock signal based on a fixed delay in step 508. A variable delay element 300-1 delays the data signal in step 510. The sampling module 240 samples values of the data signal based on the clock signal in step 512. The sample value storage module 270 stores the sampled values in association with the corresponding delay times in step 514.

In step 516, the method 500 determines whether the value of the data signal matches a predetermined (i.e. expected) value. If true, the method 500 continues to step 518. If false, the method 500 ends in step 520. In step 518, the variable delay element 300-1 changes the variable delay time of the data signal by a predetermined time and the method continues to step 512. As such, the sampled values of the data signal can be stored with a corresponding delay time.

For example, the predetermined value of the data signal may be 0 or 1. The variable delay element 300-1 changes the delay time so the sampling module 240 acquires the value of the data signal when the value of the data signal is 1. As such, a plurality of sampled values of the data signal can be stored in association with respective delay times. Accordingly, a hold time of the semiconductor device 100 can be calculated based on the stored data (i.e. the stored sampled values and associated delay times). Similarly, the variable delay element 300-1 changes the delay time so the sampling module 240 acquires the value of the data signal when the value of the data signal is 0. Accordingly, a setup time of the semiconductor device 100 can be calculated based on the stored data.

Figure 12:
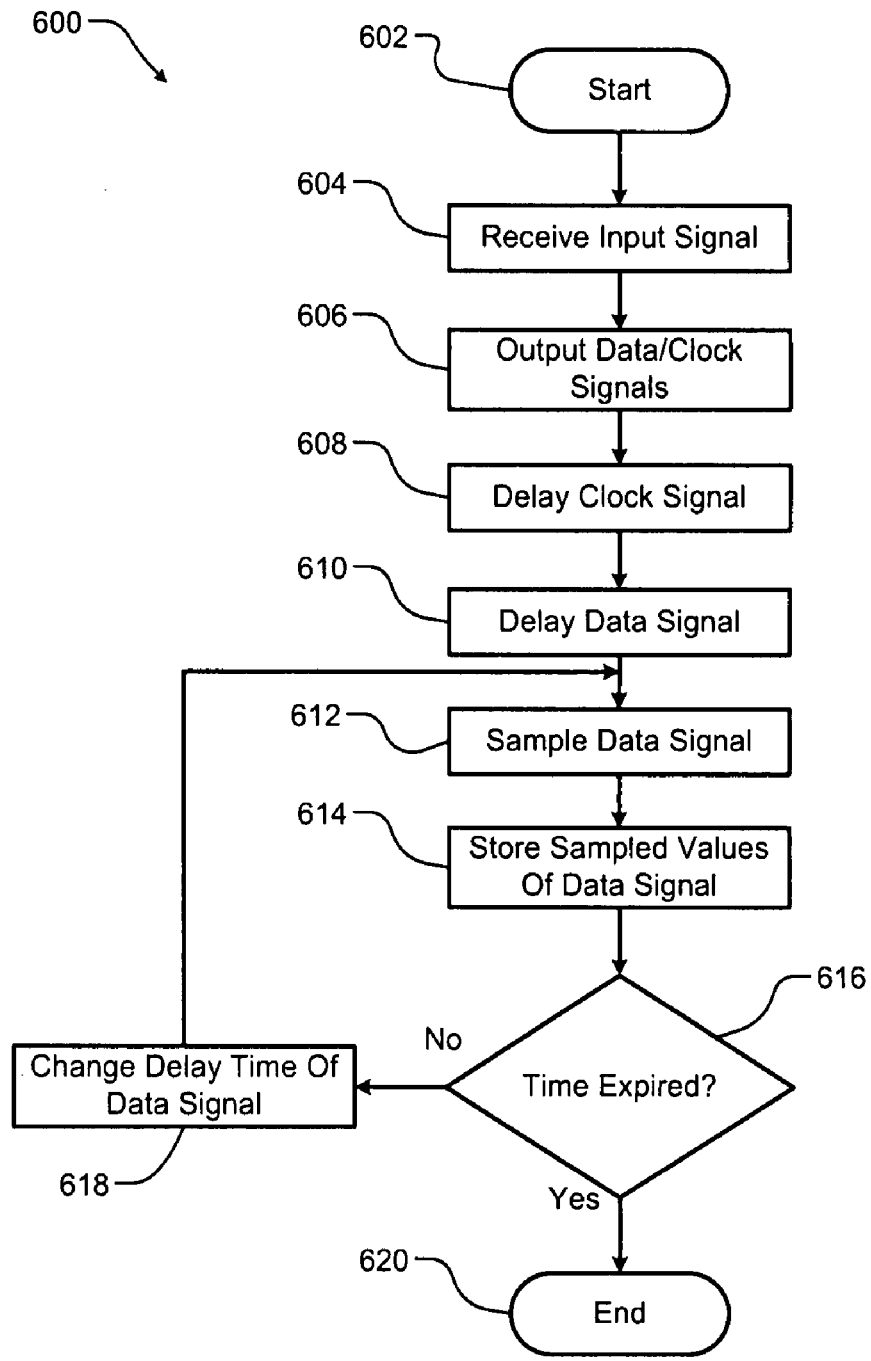
FIG. 12 is a flow diagram illustrating steps of a method for testing a semiconductor device according to the present disclosure.

Referring now to FIG. 12, a method 600 for testing a semiconductor device 100 according to the embodiments described in FIGS. 9 and 10 begins in step 602. An electronic circuit 200 of the semiconductor device 100 receives an input signal 102 in step 604. The electronic circuit 200 generates output signals 112 (e.g. a data signal and a clock signal) based on the input signal 102 in step 606. Alternatively, a clock signal generating module 272 may output the clock signal 274 as shown in FIG. 8.

A fixed delay element 300-n delays the clock signal based on a fixed delay in step 608. A variable delay element 300-1 delays the data signal in step 610. The sampling module 240 samples values of the data signal based on the clock signal in step 612. The sample value storage module 270 stores the sampled values in association with the corresponding delay times in step 614.

The method 600 determines whether a predetermined time (e.g. a time period since the sampling module 240 sampled the data signal) expired in step 616. If true, the method ends in step 620. If false, the variable delay element 300-1 changes the delay time of the data signal in step 618 and the method continues to step 612. In other words, the method 600 continues to vary the delay time of the data signal until the predetermined time expires. Setup and hold times of the semiconductor device 100 can be determined based on the stored sampled values and associated delay times.

Referring now to FIGS. 13A-13G, various exemplary implementations incorporating the teachings of the present disclosure are shown.

Figure 13A:
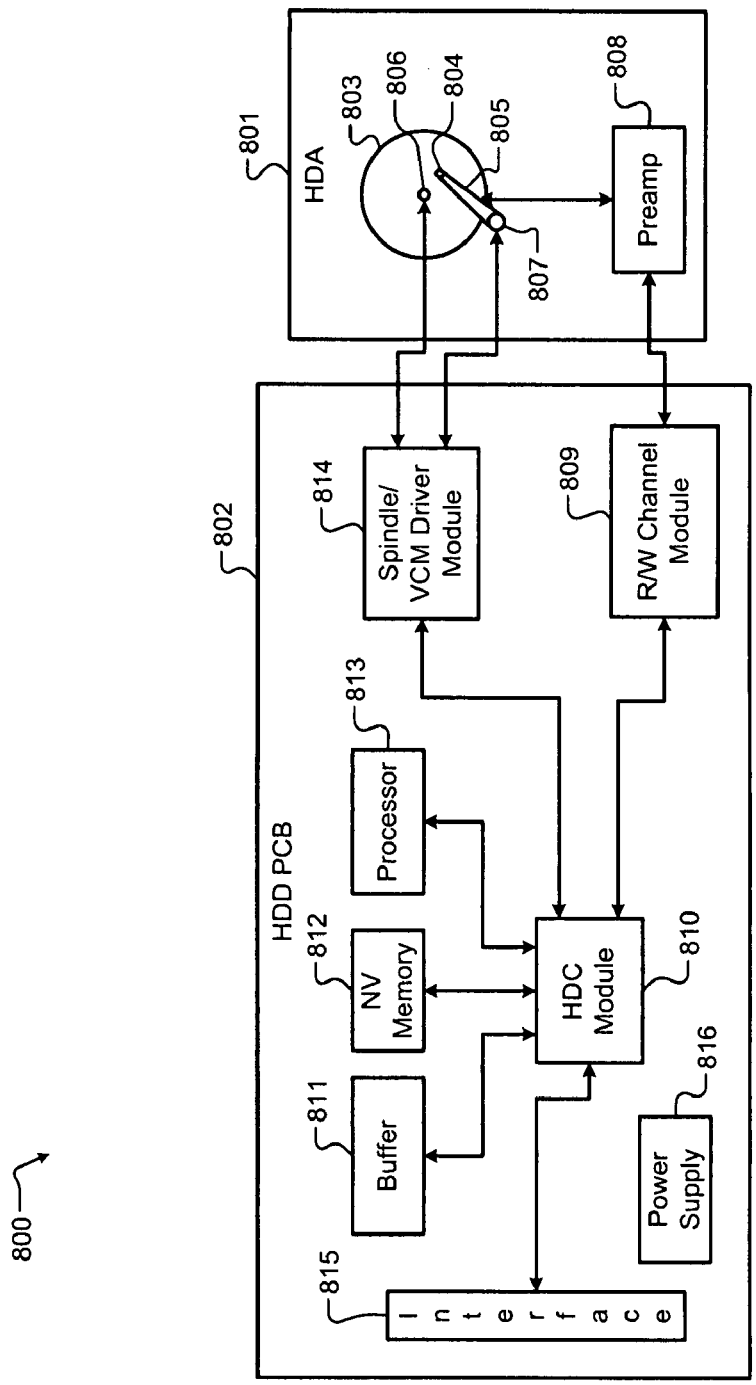
FIG. 13A is a functional block diagram of a hard disk drive.

Referring now to FIG. 13A, the teachings of the disclosure can be implemented in a hard disk controller (HDC) module 810, a processor 813, and/or a spindle/VCM driver module 814 of a hard disk drive (HDD) 800. The HDD 800 includes a hard disk assembly (HDA) 801 and a HDD PCB 802. The HDA 801 may include a magnetic medium 803, such as one or more platters that store data, and a read/write device 804. The read/write device 804 may be arranged on an actuator arm 805 and may read and write data on the magnetic medium 803. Additionally, the HDA 801 includes a spindle motor 806 that rotates the magnetic medium 803 and a voice-coil motor (VCM) 807 that actuates the actuator arm 805. A preamplifier device 808 amplifies signals generated by the read/write device 804 during read operations and provides signals to the read/write device 804 during write operations.

The HDD PCB 802 includes a read/write channel module (hereinafter, "read channel") 809, the hard disk controller (HDC) module 810, a buffer 811, nonvolatile memory 812, the processor 813, and the spindle/VCM driver module 814. The read channel 809 processes data received from and transmitted to the preamplifier device 808. The HDC module 810 controls components of the HDA 801 and communicates with an external device (not shown) via an I/O interface 815. The external device may include a computer, a multimedia device, a mobile computing device, etc. The I/O interface 815 may include wireline and/or wireless communication links.

The HDC module 810 may receive data from the HDA 801, the read channel 809, the buffer 811, nonvolatile memory 812, the processor 813, the spindle/VCM driver module 814, and/or the I/O interface 815. The processor 813 may process the data, including encoding, decoding, filtering, and/or formatting. The processed data may be output to the HDA 801, the read channel 809, the buffer 811, nonvolatile memory 812, the processor 813, the spindle/VCM driver module 814, and/or the I/O interface 815.

The HDC module 810 may use the buffer 811 and/or nonvolatile memory 812 to store data related to the control and operation of the HDD 800. The buffer 811 may include DRAM, SDRAM, etc. The nonvolatile memory 812 may include flash memory (including NAND and NOR flash memory), phase change memory, magnetic RAM, or multi-state memory, in which each memory cell has more than two states. The spindle/VCM driver module 814 controls the spindle motor 806 and the VCM 807. The HDD PCB 802 includes a power supply 816 that provides power to the components of the HDD 800.

Figure 13B:
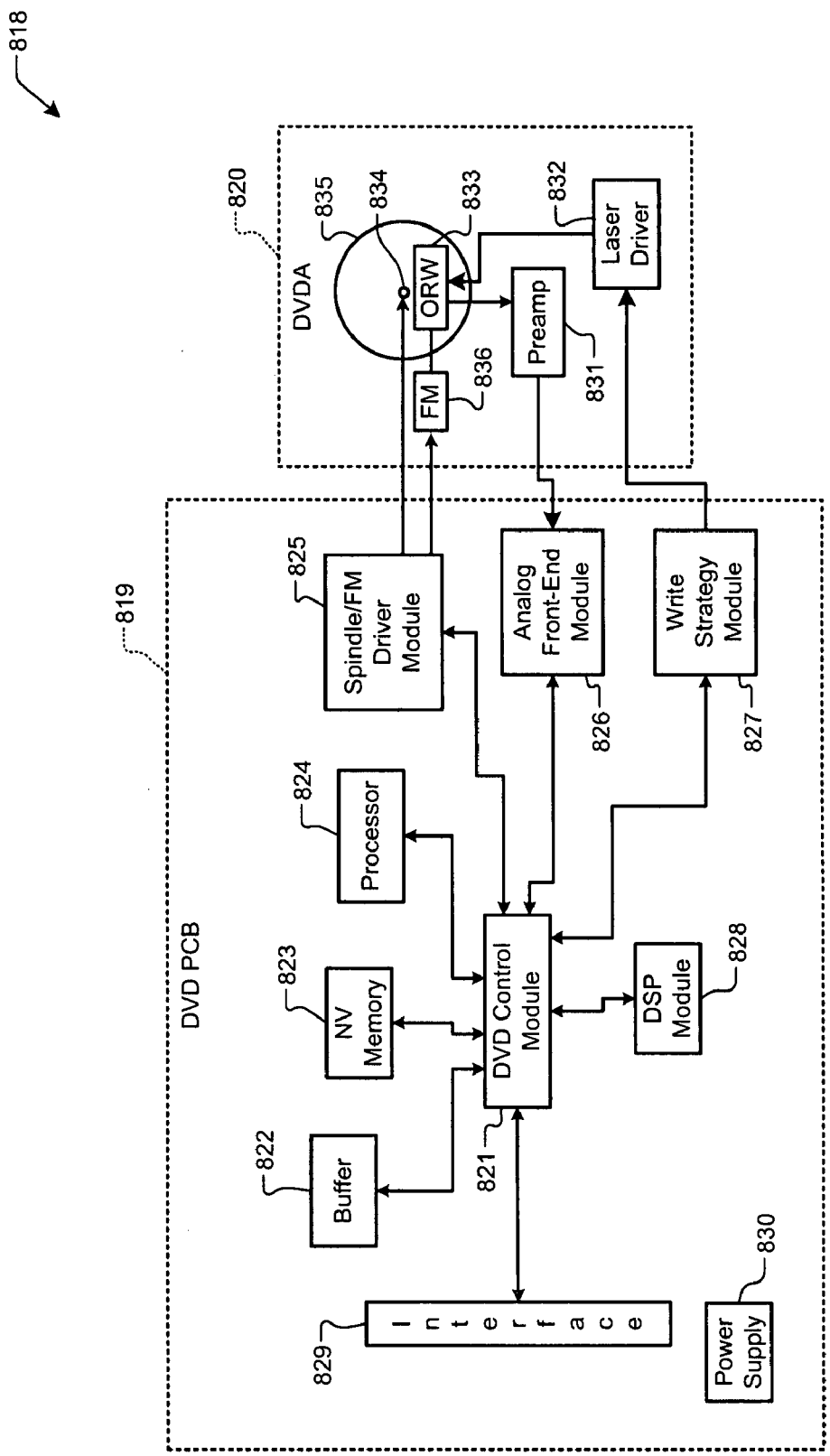
FIG. 13B is a functional block diagram of a DVD drive.

Referring now to FIG. 13B, the teachings of the disclosure can be implemented in a DVD control module 821, a processor 824, a spindle/FM (feed motor) driver module 825, an analog front-end module 826, a write strategy module 827, and/or a DSP module 828 of a DVD drive 818 or of a CD drive (not shown). The DVD drive 818 includes a DVD PCB 819 and a DVD assembly (DVDA) 820. The DVD PCB 819 includes the DVD control module 821, a buffer 822, nonvolatile memory 823, the processor 824, the spindle/FM (feed motor) driver module 825, the analog front-end module 826, the write strategy module 827, and the DSP module 828.

The DVD control module 821 controls components of the DVDA 820 and communicates with an external device (not shown) via an I/O interface 829. The external device may include a computer, a multimedia device, a mobile computing device, etc. The I/O interface 829 may include wireline and/or wireless communication links.

The DVD control module 821 may receive data from the buffer 822, nonvolatile memory 823, the processor 824, the spindle/FM driver module 825, the analog front-end module 826, the write strategy module 827, the DSP module 828, and/or the I/O interface 829. The processor 824 may process the data, including encoding, decoding, filtering, and/or formatting. The DSP module 828 performs signal processing, such as video and/or audio coding/decoding. The processed data may be output to the buffer 822, nonvolatile memory 823, the processor 824, the spindle/FM driver module 825, the analog front-end module 826, the write strategy module 827, the DSP module 828, and/or the I/O interface 829.

The DVD control module 821 may use the buffer 822 and/or nonvolatile memory 823 to store data related to the control and operation of the DVD drive 818. The buffer 822 may include DRAM, SDRAM, etc. The nonvolatile memory 823 may include flash memory (including NAND and NOR flash memory), phase change memory, magnetic RAM, or multi-state memory, in which each memory cell has more than two states. The DVD PCB 819 includes a power supply 830 that provides power to the components of the DVD drive 818.

The DVDA 820 may include a preamplifier device 831, a laser driver 832, and an optical device 833, which may be an optical read/write (ORW) device or an optical read-only (OR) device. A spindle motor 834 rotates an optical storage medium 835, and a feed motor 836 actuates the optical device 833 relative to the optical storage medium 835.

When reading data from the optical storage medium 835, the laser driver provides a read power to the optical device 833. The optical device 833 detects data from the optical storage medium 835, and transmits the data to the preamplifier device 831. The analog front-end module 826 receives data from the preamplifier device 831 and performs such functions as filtering and A/D conversion. To write to the optical storage medium 835, the write strategy module 827 transmits power level and timing information to the laser driver 832. The laser driver 832 controls the optical device 833 to write data to the optical storage medium 835.

Figure 13D:
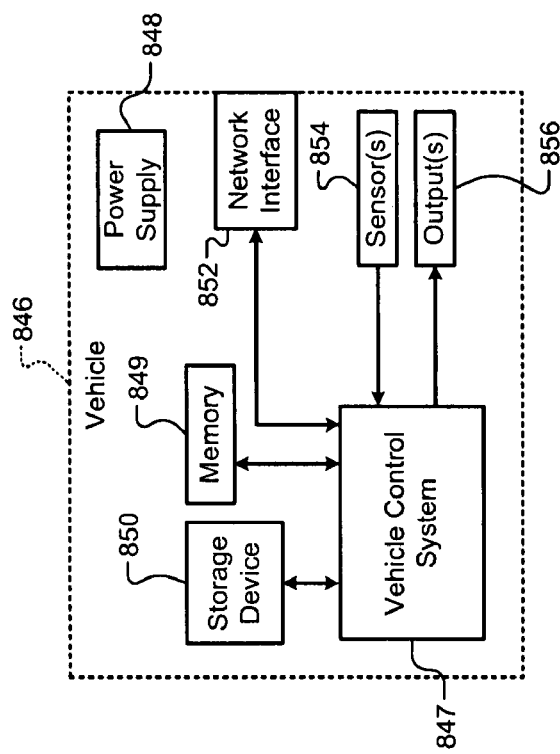
FIG. 13D is a functional block diagram of a vehicle control system.
Figure 13C:
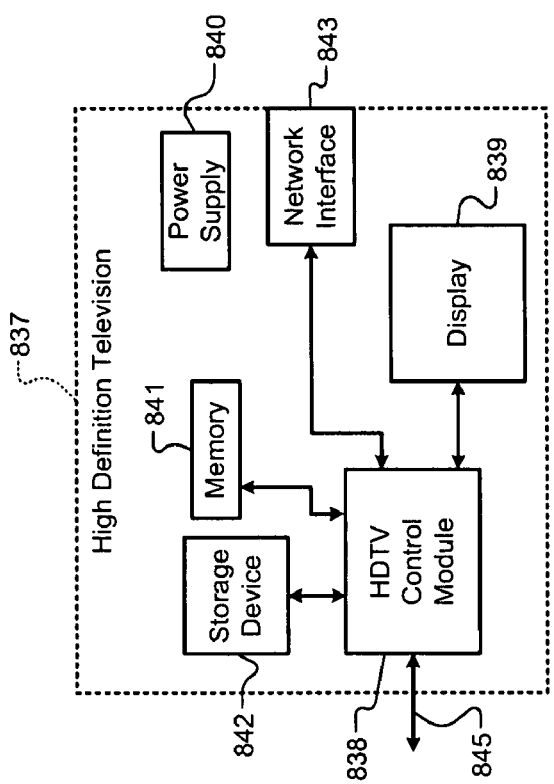
FIG. 13C is a functional block diagram of a high definition television.

Referring now to FIG. 13C, the teachings of the disclosure can be implemented in a HDTV control module 838 of a high definition television (HDTV) 837. The HDTV 837 includes the HDTV control module 838, a display 839, a power supply 840, memory 841, a storage device 842, a network interface 843, and an external interface 845.

The HDTV 837 can receive input signals from the network interface 843 and/or the external interface 845, which can send and receive information via cable, broadband Internet, and/or satellite. The HDTV control module 838 may process the input signals, including encoding, decoding, filtering, and/or formatting, and generate output signals. The output signals may be communicated to one or more of the display 839, memory 841, the storage device 842, the network interface 843, and the external interface 845.

Memory 841 may include random access memory (RAM) and/or nonvolatile memory such as flash memory, phase change memory, or multi-state memory, in which each memory cell has more than two states. The storage device 842 may include an optical storage drive, such as a DVD drive, and/or a hard disk drive (HDD). The HDTV control module 838 communicates externally via the network interface 843 and/or the external interface 845. The power supply 840 provides power to the components of the HDTV 837.

Referring now to FIG. 13D, the teachings of the disclosure may be implemented in a vehicle control system 847 of a vehicle 846. The vehicle 846 may include the vehicle control system 847, a power supply 848, memory 849, a storage device 850, and a network interface 852. The vehicle control system 847 may be a powertrain control system, a body control system, an entertainment control system, an anti-lock braking system (ABS), a navigation system, a telematics system, a lane departure system, an adaptive cruise control system, etc.

The vehicle control system 847 may communicate with one or more sensors 854 and generate one or more output signals 856. The sensors 854 may include temperature sensors, acceleration sensors, pressure sensors, rotational sensors, airflow sensors, etc. The output signals 856 may control engine operating parameters, transmission operating parameters, suspension parameters, etc.

The power supply 848 provides power to the components of the vehicle 846. The vehicle control system 847 may store data in memory 849 and/or the storage device 850. Memory 849 may include random access memory (RAM) and/or nonvolatile memory such as flash memory, phase change memory, or multi-state memory, in which each memory cell has more than two states. The storage device 850 may include an optical storage drive, such as a DVD drive, and/or a hard disk drive (HDD). The vehicle control system 847 may communicate externally using the network interface 852.

Figure 13F:
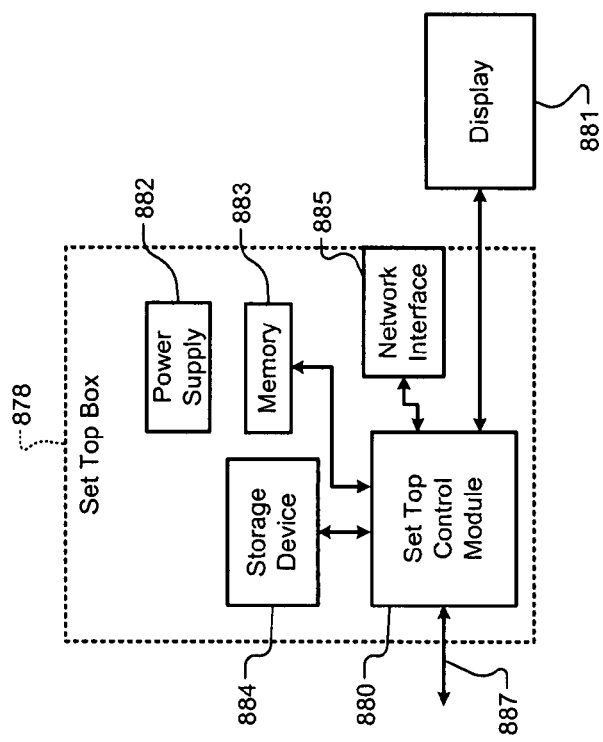
FIG. 13F is a functional block diagram of a set top box.
Figure 13E:
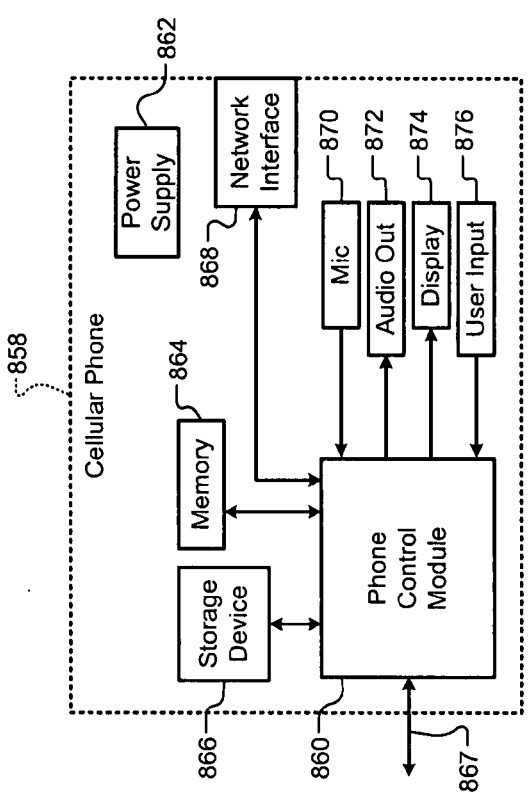
FIG. 13E is a functional block diagram of a cellular phone.

Referring now to FIG. 13E, the teachings of the disclosure can be implemented in a phone control module 860 of a cellular phone 858. The cellular phone 858 includes the phone control module 860, a power supply 862, memory 864, a storage device 866, and a cellular network interface 867. The cellular phone 858 may include a network interface 868, a microphone 870, an audio output 872 such as a speaker and/or output jack, a display 874, and a user input device 876 such as a keypad and/or pointing device.

The phone control module 860 may receive input signals from the cellular network interface 867, the network interface 868, the microphone 870, and/or the user input device 876. The phone control module 860 may process signals, including encoding, decoding, filtering, and/or formatting, and generate output signals. The output signals may be communicated to one or more of memory 864, the storage device 866, the cellular network interface 867, the network interface 868, and the audio output 872.

Memory 864 may include random access memory (RAM) and/or nonvolatile memory such as flash memory, phase change memory, or multi-state memory, in which each memory cell has more than two states. The storage device 866 may include an optical storage drive, such as a DVD drive, and/or a hard disk drive (HDD). The power supply 862 provides power to the components of the cellular phone 858.

Referring now to FIG. 13F, the teachings of the disclosure can be implemented in a set top control module 880 of a set top box 878. The set top box 878 includes the set top control module 880, a display 881, a power supply 882, memory 883, a storage device 884, and a network interface 885.

The set top control module 880 may receive input signals from the network interface 885 and an external interface 887, which can send and receive information via cable, broadband Internet, and/or satellite. The set top control module 880 may process signals, including encoding, decoding, filtering, and/or formatting, and generate output signals. The output signals may include audio and/or video signals in standard and/or high definition formats. The output signals may be communicated to the network interface 885 and/or to the display 881. The display 881 may include a television, a projector, and/or a monitor.

The power supply 882 provides power to the components of the set top box 878. Memory 883 may include random access memory (RAM) and/or nonvolatile memory such as flash memory, phase change memory, or multi-state memory, in which each memory cell has more than two states. The storage device 884 may include an optical storage drive, such as a DVD drive, and/or a hard disk drive (HDD).

Figure 13G:
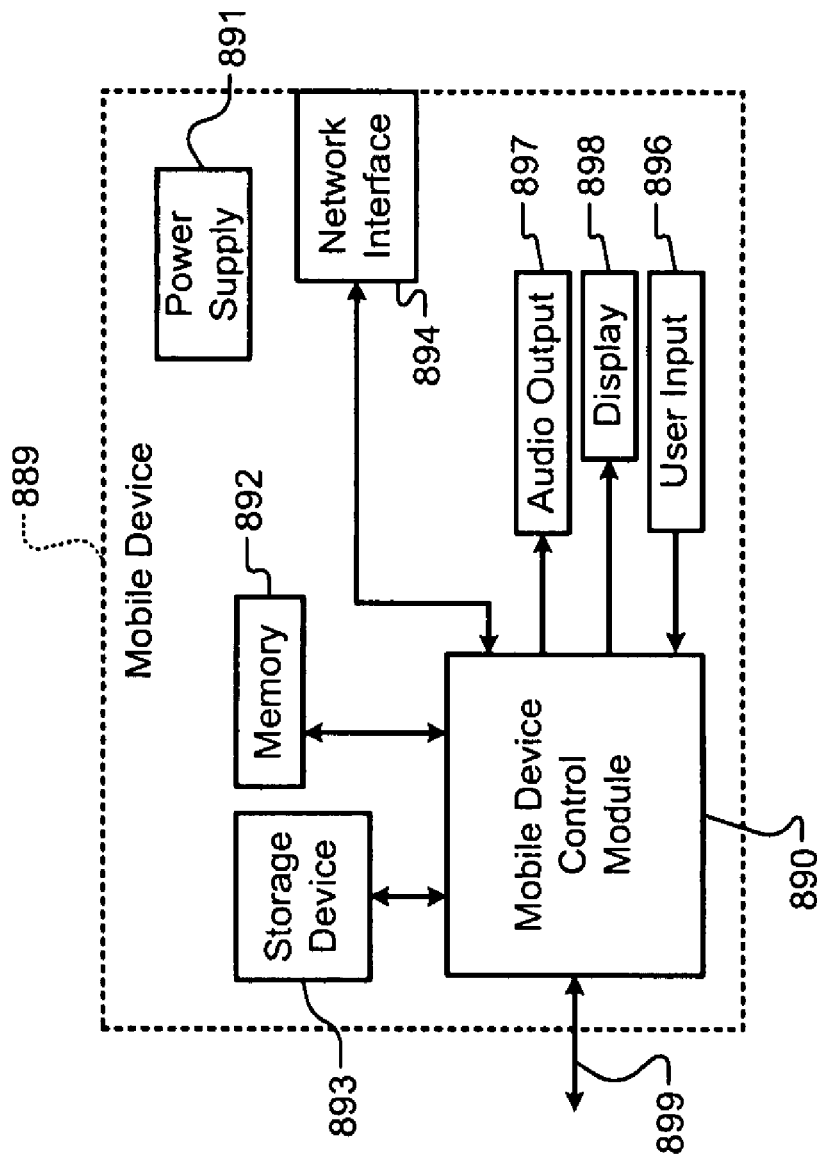
FIG. 13G is a functional block diagram of a mobile device.

Referring now to FIG. 13G, the teachings of the disclosure can be implemented in a mobile device control module 890 of a mobile device 889. The mobile device 889 may include the mobile device control module 890, a power supply 891, memory 892, a storage device 893, a network interface 894, and an external interface 899.

The mobile device control module 890 may receive input signals from the network interface 894 and/or the external interface 899. The external interface 899 may include USB, infrared, and/or Ethernet. The input signals may include compressed audio and/or video, and may be compliant with the MP3 format. Additionally, the mobile device control module 890 may receive input from a user input 896 such as a keypad, touchpad, or individual buttons. The mobile device control module 890 may process input signals, including encoding, decoding, filtering, and/or formatting, and generate output signals.

The mobile device control module 890 may output audio signals to an audio output 897 and video signals to a display 898. The audio output 897 may include a speaker and/or an output jack. The display 898 may present a graphical user interface, which may include menus, icons, etc. The power supply 891 provides power to the components of the mobile device 889. Memory 892 may include random access memory (RAM) and/or nonvolatile memory such as flash memory, phase change memory, or multi-state memory, in which each memory cell has more than two states. The storage device 893 may include an optical storage drive, such as a DVD drive, and/or a hard disk drive (HDD). The mobile device may include a personal digital assistant, a media player, a laptop computer, a gaming console or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A semiconductor device comprising:
   a module under test
      that is integrated with the semiconductor device,
      that receives an input signal from a test module,
      that provides an output signal to at least one output terminal based on the input signal, and
      that generates an error detection signal that is based on the input signal; and
   an error detecting module
      that is integrated with the semiconductor device,
      that samples values of the output signal and the error detection signal,
      that outputs the sampled values to the test module,
      that generates a verification result for the output signal, and
      that detects errors in the output signal based on a comparison between the error detection signal and the verification result.

2. The semiconductor device of claim 1 further comprising the test module.

3. A system comprising the semiconductor device of claim 1 and further comprising the test module.

4. The semiconductor device of claim 1 wherein:
   the test module includes a pattern generator module; and
   the module under test receives the input signal from the pattern generator module.

5. The semiconductor device of claim 1 wherein:
   the test module includes a test result module; and
   the test result module receives the sampled values from the error detecting module.

6. The semiconductor device of claim 5 wherein the test result module determines a status of the semiconductor device based on the sampled values.

7. The semiconductor device of claim 1 wherein the error detecting module includes a sampling module that samples the values of the output signal.

8. The semiconductor device of claim 1 further comprising a feedback circuit that receives the output signal from the module under test and provides the output signal to the error detecting module.

9. The semiconductor device of claim 1 wherein the error detecting module further comprises a memory that receives the output signal from the module under test and stores data indicative of the output signal.

10. The semiconductor device of claim 9 wherein the data is bit data.

11. The semiconductor device of claim 9 wherein the error detecting module receives the data from the memory and detects errors in the output signal based on the data.

12. The semiconductor device of claim 1 wherein:
the module under test outputs a clock signal; and
the error detecting module samples the values of the output signal based on the clock signal.

13. The semiconductor device of claim 12 further comprising a first delay element that receives the output signal.

14. The semiconductor device of claim 13 further comprising a second delay element that delays the clock signal.

15. The semiconductor device of claim 14 wherein the first delay element is a variable delay element and the second delay element is a fixed delay element.

16. The semiconductor device of claim 1 wherein the error detecting module includes a comparator module that compares the sampled values to expected values.

17. The semiconductor device of claim 16 wherein the error detecting module includes an expected value storage module that stores the expected values.

18. The semiconductor device of claim 16 wherein the error detecting module includes a comparison result storage module that stores results of the comparison and provides the results to the test module.

19. The semiconductor device of claim 16 wherein the error detecting module includes a comparison result module that determines a status of the semiconductor device based on the comparison.

20. The semiconductor device of claim 16 wherein the error detecting module includes an expected value calculating module that receives the input signal and calculates the expected values based on the input signal.

21. The semiconductor device of claim 1 wherein the error detecting module includes a clock signal generating module that receives the input signal and generates a clock signal based on the input signal.

22. The semiconductor device of claim 1 wherein the error detecting module includes a sample value storage module that stores the sampled values.

23. A semiconductor device comprising:
a module under test
that is integrated with the semiconductor device,
that receives an input signal from a test module, and
that provides an output signal to at least one output terminal based on the input signal;
an error detecting module
that is integrated with the semiconductor device,
that samples values of the output signal, and
that outputs the sampled values to the test module,
wherein the module under test outputs a clock signal and the error detecting module samples the values of the output signal based on the clock signal;
a first delay element that receives the output signal; and
a second delay element that delays the clock signal,
wherein the first delay element is a variable delay element and the second delay element is a fixed delay element; and
wherein a delay of the first delay element is variable between a first delay time that is less than a delay of the second delay element and a second delay time that is greater than the delay of the second delay element.

24. The semiconductor device of claim 23 wherein the delay of the second delay element is greater than at least one of a setup time and a hold time of the semiconductor device.

25. The semiconductor device of claim 24 wherein:
a difference between a maximum delay time of the first delay element; and
the delay of the second delay element is greater than at least one of the setup time and the hold time.

26. A semiconductor device comprising:
a module under test
that is integrated with the semiconductor device,
that receives an input signal from a test module, and
that provides an output signal to at least one output terminal based on the input signal;
an error detecting module
that is integrated with the semiconductor device,
that samples values of the output signal, and
that outputs the sampled values to the test module,
wherein the module under test outputs a clock signal and the error detecting module samples the values of the output signal based on the clock signal;
a first delay element that receives the output signal; and
a second delay element that delays the clock signal,
wherein the error detecting module samples the output signal when a delay time of the first delay element is changed.

27. A method for testing a semiconductor device, the method comprising:
receiving an input signal from a test module at a module under test that is integrated with the semiconductor device;
providing an output signal to at least one output terminal based on the input signal;
generating an error detection signal that is based on the input signal;
sampling values of the output signal and the error detection signal at an error detecting module that is integrated with the semiconductor device;
outputting the sampled values to the test module;
generating a verification result for the output signal; and
detecting errors in the output signal based on a comparison between the error detection signal and the verification result.

28. The method of claim 27 further comprising receiving the input signal from a pattern generator module.

29. The method of claim 27 further comprising receiving the sampled values at a test result module.

30. The method of claim 29 further comprising determining a status of the semiconductor device based on the sampled values.

31. The method of claim 27 further comprising:
receiving the output signal from the module under test at a feedback circuit; and
providing the output signal to the error detecting module.

32. The method of claim 27 further comprising:
receiving the output signal at a memory; and
storing data indicative of the output signal.

33. The method of claim 32 wherein the data is bit data.

34. The method of claim 32 further comprising:
receiving the data from the memory; and
detecting errors in the output signal based on the data.

35. The method of claim 27 further comprising:
outputting a clock signal from the module under test; and
sampling the values of the output signal based on the clock signal.

36. The method of claim 35 further comprising delaying the output signal based on a first delay.

37. The method of claim 36 further comprising delaying the clock signal based on a second delay.

38. The method of claim 37 wherein the first delay is a variable delay and the second delay is a fixed delay.

39. The method of claim 27 further comprising comparing the sampled values to expected values.

40. The method of claim 39 further comprising storing the expected values.

41. The method of claim 39 further comprising:
storing results of the comparison; and
providing the results to the test module.

42. The method of claim 39 further comprising determining a status of the semiconductor device based on the comparison.

43. The method of claim 39 further comprising calculating the expected values based on the input signal.

44. The method of claim 27 further comprising storing the sampled values.

45. A method for testing a semiconductor device, the method comprising:
receiving an input signal from a test module at a module under test that is integrated with the semiconductor device;
providing an output signal to at least one output terminal based on the input signal;
sampling values of the output signal at an error detecting module that is integrated with the semiconductor device;
outputting the sampled values to the test module;
outputting a clock signal from the module under test;
sampling the values of the output signal based on the clock signal;
delaying the output signal based on a first delay; and
delaying the clock signal based on a second delay, wherein the first delay is a variable delay and the second delay is a fixed delay, and
wherein the first delay is variable between a first delay time that is less than the second delay and a second delay time that is greater than the second delay.

46. A method for testing a semiconductor device, the method comprising:
receiving an input signal from a test module at a module under test that is integrated with the semiconductor device;
providing an output signal to at least one output terminal based on the input signal;
sampling values of the output signal at an error detecting module that is integrated with the semiconductor device;
outputting the sampled values to the test module;
outputting a clock signal from the module under test;
sampling the values of the output signal based on the clock signal;
delaying the output signal based on a first delay; and
sampling the output signal when the first delay is changed.

47. A method for testing a semiconductor device, the method comprising:
receiving an input signal from a test module at a module under test that is integrated with the semiconductor device;
providing an output signal to at least one output terminal based on the input signal;
sampling values of the output signal at an error detecting module that is integrated with the semiconductor device;
outputting the sampled values to the test module;
outputting a clock signal from the module under test;
sampling the values of the output signal based on the clock signal;
delaying the output signal based on a first delay; and
delaying the clock signal based on a second delay,
wherein the second delay is greater than at least one of a setup time and a hold time of the semiconductor device.

48. The method of claim 47 wherein a difference between a maximum delay time of the first delay and the second delay is greater than at least one of the setup time and the hold time.

* * * * *